(12) United States Patent
Muchherla et al.

(10) Patent No.: US 10,325,668 B2
(45) Date of Patent: Jun. 18, 2019

(54) OPERATION OF MIXED MODE BLOCKS

(71) Applicant: Micron Technology, Inc., Boise, ID (US)

(72) Inventors: Kishore K. Muchherla, Fremont, CA (US); Ashutosh Malshe, Fremont, CA (US); Preston A. Thomson, Boise, ID (US); Michael G. Miller, Boise, ID (US); Gary F. Besinga, Boise, ID (US); Scott A. Stoller, Boise, ID (US); Sampath K. Ratnam, Boise, ID (US); Renato C. Padilla, Folsom, CA (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 15/479,356

(22) Filed: Apr. 5, 2017

(65) Prior Publication Data
US 2018/0293001 A1 Oct. 11, 2018

(51) Int. Cl.
*G11C 16/34* (2006.01)
(52) U.S. Cl.
CPC .... *G11C 16/349* (2013.01); *G11C 2211/5641* (2013.01)
(58) Field of Classification Search
None
See application file for complete search history.

(56) References Cited

U.S. PATENT DOCUMENTS

| | | |
|---|---|---|
| 6,732,221 B2 | 5/2004 | Ban |
| 7,701,768 B2 | 4/2010 | Hwang |
| 7,948,798 B1 | 5/2011 | Sheredy et al. |
| 8,078,794 B2 | 12/2011 | Lee et al. |
| 8,639,877 B2 | 1/2014 | Benhase et al. |
| 8,832,506 B2 | 9/2014 | Griffin et al. |
| 9,146,851 B2 | 9/2015 | Pittelko |
| 9,195,588 B2 | 11/2015 | Cepulis |
| 9,356,105 B1 | 5/2016 | Lue |
| 9,684,468 B2 | 6/2017 | Fisher |
| 2013/0173844 A1 | 7/2013 | Chen et al. |

(Continued)

FOREIGN PATENT DOCUMENTS

| | | |
|---|---|---|
| TW | 201535114 A | 9/2015 |
| TW | 201624628 A | 7/2016 |
| WO | 2010144139 A2 | 12/2010 |

OTHER PUBLICATIONS

International Search Report and Written Opinion from related international application No. PCT/US2018/022587, dated Jun. 28, 2018, 15 pp.

(Continued)

*Primary Examiner* — Denise Tran
(74) *Attorney, Agent, or Firm* — Brooks, Cameron & Huebsch, PLLC

(57) ABSTRACT

Apparatuses and methods for operating mixed mode blocks. One example method can include tracking single level cell (SLC) mode cycles and extra level cell (XLC) mode cycles performed on the mixed mode blocks, maintaining a mixed mode cycle count corresponding to the mixed mode blocks, and adjusting the mixed mode cycle count differently for mixed mode blocks operated in a SLC mode than for mixed blocks operated in a XLC mode.

14 Claims, 3 Drawing Sheets

(56) References Cited

U.S. PATENT DOCUMENTS

| | | | |
|---|---|---|---|
| 2014/0006688 A1* | 1/2014 | Yu | G11C 16/10 |
| | | | 711/103 |
| 2014/0101499 A1 | 4/2014 | Griffin et al. | |
| 2014/0181595 A1 | 6/2014 | Hoang et al. | |
| 2015/0058530 A1 | 2/2015 | Reddy et al. | |

OTHER PUBLICATIONS

Office Action from related Taiwanese patent application No. 107111560, dated Apr. 15, 2019, 16 pp.

* cited by examiner

| | ACTUAL CYCLE COUNT | EFFECTIVE CYCLE COUNT |
|---|---|---|
| MLC | 2Y(SLC) + 2Y(MLC) | 2Y/2(MLC) + 2Y(MLC) |
| TLC | 3Y(SLC) + 2Y(TLC) | 3Y/2(TLC) + 2Y(TLC) |
| QLC | 4Y(SLC) + 2Y(QLC) | 4Y/2(QLC) + 2Y(QLC) |

*Fig. 3*

OPERATION OF MIXED MODE BLOCKS

TECHNICAL FIELD

The present disclosure relates generally to memory devices, and more particularly, to apparatuses and methods for operation of mixed mode blocks.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

In various instances, a single level memory cell (SLC) can refer to a cell programmed to a targeted one of two different data states and configured to store a single data unit (e.g., one bit). Some memory cells (e.g., Flash cells, phase change cells, etc.) can be programmed to a targeted one of more than two different data states such that they are configured to store more than a single data unit (e.g., 2 bits, 2.5 bits, 3 bits, 4 bits, etc.). Such cells may be referred to as multi state memory cells, multiunit cells, multilevel cells, or extra level cells (XLCs). XLCs can provide higher density memories without increasing the number of memory cells since each cell can represent more than one data unit.

Various memory cells experience wear over time due to programming and/or erase cycling, for instance. Memory devices comprising such memory cells can have device specifications such as a total bytes written (TBW) specification and/or a cycle count (e.g., erase count and/or program count) specification, for example, used to gauge a device's health and/or useful life. Some memory cells are capable of being operated (e.g., programmed, read, erased, etc.) in both an SLC mode and an XLC mode (e.g., 2-bit "MLC" mode, 3-bit "TLC" mode, 4-bit "QLC" mode, etc.). Such cells can be referred to as "mixed mode" memory cells. Providing accurate device specifications for mixed mode memory devices can be challenging.

BRIEF DESCRIPTION OF THE DRAWINGS

FIG. 3 is a table illustrating comparisons of actual cycle counts to effective cycle counts for a number of different XLC operating modes in accordance with a number of embodiments of the present disclosure.

DETAILED DESCRIPTION

Figure 1:
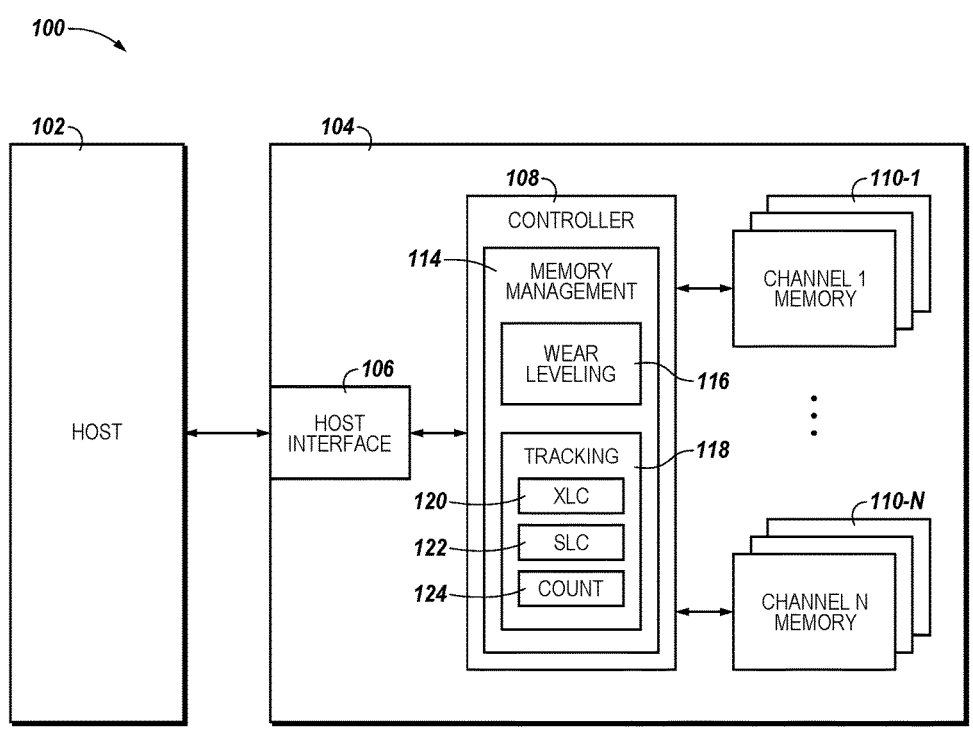
FIG. 1 is a block diagram of an apparatus in the form of a computing system including at least one memory system in accordance a number of embodiments of the present disclosure.

Apparatuses and methods for operating mixed mode blocks. In one or more embodiments of the present disclosure, a controller may be coupled to a memory. The controller may be configured to track single level cell (SLC) mode cycles and extra level cell (XLC) mode cycles performed on the mixed mode blocks, maintain a mixed mode cycle count corresponding to the mix mode blocks, and adjust the mixed mode cycle count differently for mixed mode blocks operated in a SLC mode than for mixed mode blocks operated in a XLC mode.

One example method can include tracking single level cell (SLC) mode cycles and extra level cell (XLC) mode cycles of mixed mode blocks of memory cells and determining a mixed mode cycle count by adjusting a counter by a first amount for each SLC mode cycle and adjusting the counter by a second amount for each XLC mode cycle. In a number of embodiments, mixed mode blocks are XLC blocks operating in both SLC mode and XLC mode. Host data written in SLC mode is faster and more reliable than writing host data in XLC mode. In a number of embodiments, once a drive reaches a particular threshold capacity, SLC data is folded into XLC cells (e.g., via garbage collection).

The life time of the drive, known as drive life can be expressed as a metric of total bytes written (TBW), which is the amount of bytes that can be written to a drive in the life time of the drive. The TBW can be determined, for example, based on the number of memory blocks multiplied by the amount of data per memory block multiplied by the number of cycles. The amount of data per memory block is dependent on the operating mode (e.g., XLC or SLC).

Typically an advertised user size of a system is based on memory written in a native XLC operating mode. Native XLC operating modes can include an N-bit mode where N is a real number greater than zero. For example, in a number of embodiments the XLC operating mode can include 2-bit per cell mode, which may be referred to as multilevel cell (MLC) mode, 3-bit per cell mode, which may be referred to as triple level cell (TLC) mode, and 4-bit per cell mode, which may be referred to as quadruple level cell (QLC) mode, among various other XLC modes. Accordingly, for a given amount of data, programming a mixed mode block in SLC mode results in two, three, or four times the quantity of physical cycles as compared to programming the blocks in MLC, TLC, or QLC mode, respectively. Therefore using an XLC block in SLC mode consumes more cycles and hence requires additional XLC endurance capability.

Wear rate on memory blocks is typically proportional to the cycle count and the wear rate and/or cycle count can be treated as a metric for cell degradation. Cell endurance capability of an XLC block can be specified as XLC program/erase cycles (PEC). When operating mixed mode blocks in SLC or XLC mode the wear ratio of SLC to XLC operation is a measure of cell degradation.

In a number of embodiments of the present disclosure, the TBW specification associated with an apparatus is based on a mixed mode cycle count, which can be referred to as an "effective cycle count" since it is different than a count of the actual physical cycles experienced by mixed mode blocks. Determining drive life and/or TBW based on a determined effective cycle count and/or performing wear leveling based on the effective cycle count can improve the performance (e.g., increase the speed, increase the reliability, and/or decrease the power consumption) of the memory and/or increase the endurance (e.g., increase the lifetime) of the memory, among other benefits. Using the effective cycle count to determine TBW instead of an actual cycle count in a mixed operating mode may also provide a more accurate TBW value. Since the actual cycle count is always higher than the effective cycle count, reporting the drive life (e.g., the percentage of NAND program erase cycle capability that has been already consumed in terms of actual erase count) results in a pessimistic drive life when compared to the true life of the NAND.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices. Additionally, designators such as "N", "M", "S", and "R", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including at least one memory system in accordance with a number of embodiments of the present disclosure. As used herein, a memory system (e.g., 104), a controller (e.g., 108), or a memory device (e.g., 110-1) might also be separately considered an "apparatus". The memory system 104 can be a solid state drive (SSD), for instance, and can include a host interface 106, a controller 108 (e.g., a processor and/or other control circuitry), and a memory (e.g., a number of memory devices 110-1, . . . , 110-N), which can comprise solid state memory devices such as NAND flash devices and can provide a storage volume for the memory system 104. The memory devices 110-1, . . . , 110-N can be referred to collectively as memory devices 110 and/or as memory 110). In a number of embodiments, the controller 108, the memory 110, and/or the host interface 106 can be physically located on a single die or within a single package (e.g., a managed NAND application).

As illustrated in FIG. 1, the controller 108 can be coupled to the host interface 106 and to the memory 110 via a plurality of channels and can be used to transfer data between the memory system 104 and host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors).

The memory devices 110-1, . . . , 110-N can include a number of arrays of memory cells (e.g., non-volatile memory cells). The arrays can be flash arrays with a NAND architecture, for example. However, embodiments are not limited to a particular type of memory array or array architecture. As described further below in connection with FIG. 2, the memory cells can be grouped, for instance, into a number of blocks including a number of physical pages of memory cells. In a number of embodiments, a block refers to a group of memory cells that are erased together as a unit. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from a memory device of a memory system (e.g., memory devices 110-1, . . . , 110-N of system 104) as a page of data, for example. As such, a page of data can be referred to as a data transfer size of the memory system. Data can be transferred to/from a host (e.g., host 102) in data segments referred to as sectors (e.g., host sectors). As such, a sector of data can be referred to as a data transfer size of the host.

The controller 108 can communicate with the memory devices 110-1, . . . , 110-N to control data read, write, and erase operations, among other operations. The controller 108 can include, for example, a number of components in the form of hardware and/or firmware (e.g., one or more integrated circuits) and/or software for controlling access to the number of memory devices 110-1, . . . , 110-N and/or for facilitating data transfer between the host 102 and memory devices 110-1, . . . , 110-N. For instance, in the example illustrated in FIG. 1, the controller 108 includes a memory management component 114, which comprises a wear leveling component 116 and a tracking component 118. As shown in FIG. 1, the tracking component 118 can include an XLC cycle tracker 120 ("XLC"), a SLC cycle tracker 122 ("SLC"), and a mixed mode cycle counter 124 ("COUNT"). The XLC cycle tracker 120 can track (e.g., maintain a count of) physical cycles to mixed mode blocks in XLC mode (e.g., XLC mode cycles). In a number of embodiments the XLC mode cycles are XLC blocks erased and/or programmed. Similarly, the SLC cycle tracker 122 can track (e.g., maintain a count of) physical cycles to mixed mode blocks in SLC mode (e.g., SLC mode cycles). In a number of embodiments the SLC mode cycles are SLC blocks erased and/or programmed. The mixed mode cycle counter 124 can provide a mixed mode cycle count, which can be an effective cycle count or a scaled cycle count having a different value than an actual quantity of physical cycles performed on the mixed mode blocks. In a number of embodiments the mixed mode cycles are mixed mode blocks erased and/or programmed. The actual quantity of physical cycles or the unscaled count is based on the quantity of actual cycles experienced by mixed mode blocks (e.g., as determined by XLC cycle tracker 120 and SLC cycle tracker 122).

A mixed mode cycle count can be used instead of an unscaled cycle count. For example, in reporting drive health of a SSD. In a number of embodiments, the controller can be configured to report a drive health indicator of the SSD to a host based on the mixed mode cycle count as opposed to based on an unsealed cycle count corresponding to a quantity of actual physical cycles experienced by the mixed mode blocks.

In a number of embodiments, the mixed mode cycle count can be adjusted differently for mixed mode blocks operated in a SLC mode than for mixed mode blocks operated in a XLC mode. The mixed mode cycle count can be adjusted by an increment. The increment difference between SLC mode cycles and XLC mode cycles can be based on a determined wear ratio of SLC operation wear to XLC operation wear. In a number of embodiments, the mixed mode cycle count can be determined on a block by block basis. For example, the cycle count corresponding to a particular mixed mode block can be a mixed mode cycle count that is incremented differently depending on the wear ratio. The different increment amount can be based on the particular wear ratio.

In a number of embodiments, a difference by which the controller adjusts the mixed mode cycle count for mixed mode blocks operated in the SLC mode than for mixed mode blocks operated in the XLC mode is based on a wear ratio of SLC operation wear to XLC operation wear resulting from adjusted trim settings. Adjusted trim settings can be SLC trim settings adjusted from initial levels in order to achieve the particular wear ratio. SLC trim settings can include write trims and/or erase trims. In a number of embodiments, adjusted trim settings can include at least one of: a reduced SLC mode erase verify voltage, a reduced SLC mode program start voltage, a reduced SLC program verify voltage, and a reduced SLC mode program step voltage.

The memory management component 114 can implement wear leveling (e.g., via wear leveling component 116) to control the wear rate on the memory 110. Wear leveling can reduce the number of process cycles (e.g., program and/or erase cycles) performed on a particular group of cells by spreading the cycles more evenly over an entire array and/or device. Wear leveling can include dynamic wear leveling to minimize the amount of valid blocks moved to reclaim a block. Dynamic wear leveling can include a technique called garbage collection. Garbage collection can include reclaiming (e.g., erasing and making available for programming) blocks that have the most invalid pages (e.g., according to a "greedy algorithm"). Alternatively, garbage collection can include reclaiming blocks with more than a threshold amount (e.g., quantity) of invalid pages. If sufficient free blocks exist for a programming operation, then a garbage collection operation may not occur. An invalid page, for example, can be a page of data that has been updated to a different page. Static wear leveling can include writing static data to blocks that have high program/erase counts to prolong the life of the block.

The wear leveling component 116 can perform wear leveling based on the mixed mode cycle count 124, determined in accordance with a number of embodiments described herein, as opposed to based on an unscaled cycle count corresponding to a quantity of actual physical cycles experienced by the mixed mode blocks. For instance, wear leveling can be performed based on the effective cycle count by writing data to a memory block with the lowest mixed mode cycle count (e.g., as opposed to selecting a block with the lowest actual cycle count). Since the blocks wear at different rates depending on whether the block is operated in SLC or XLC mode, embodiments of the present disclosure can provide improved wear leveling as compared to previous approaches that perform wear leveling based on actual cycle counts as opposed to based on effective cycle counts as described herein.

Figure 2:
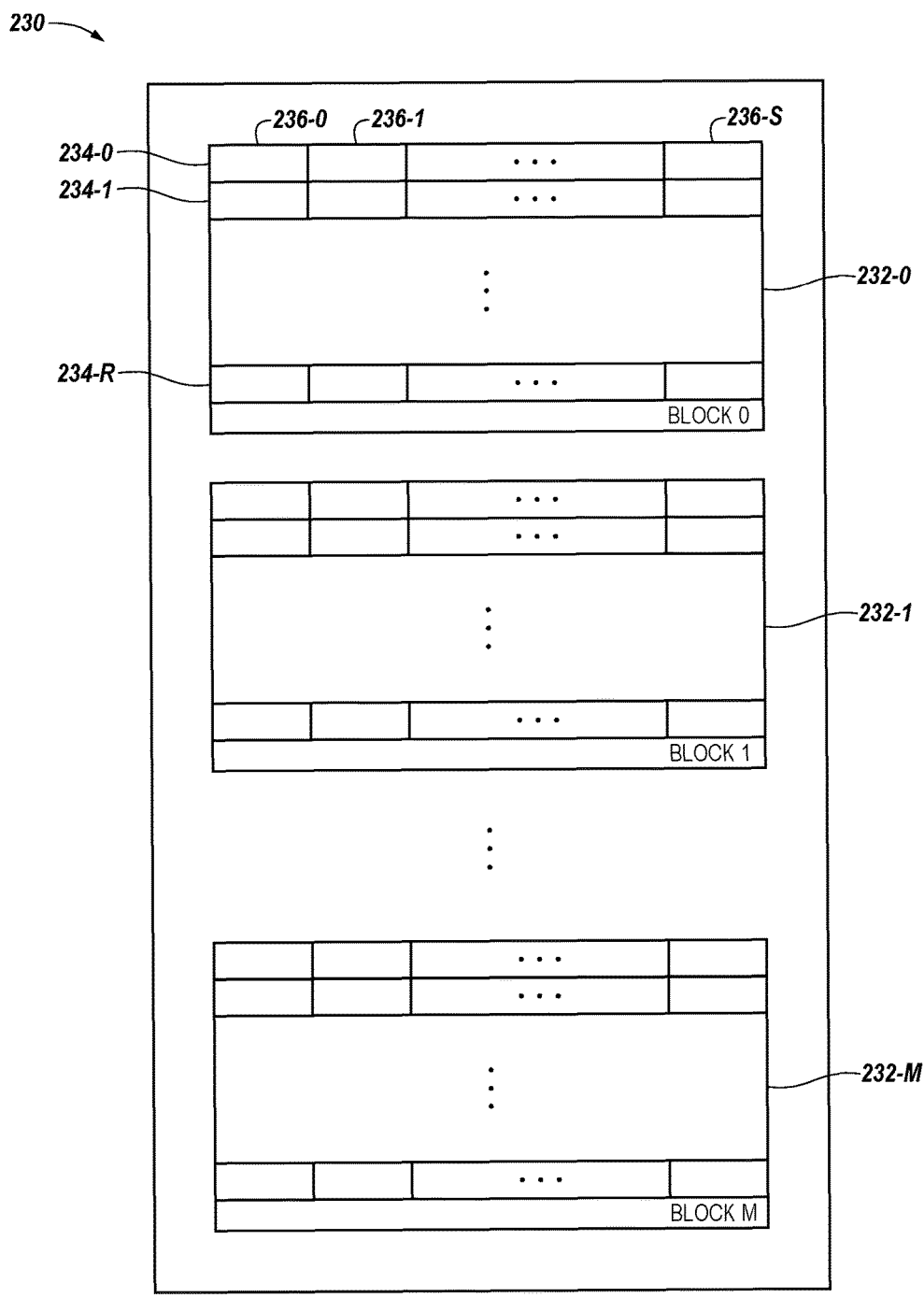
FIG. 2 illustrates a diagram of a portion of a memory array having groups of memory cells organized as a number of mixed mode physical blocks in accordance with a number of embodiments of the present disclosure.

FIG. 2 illustrates a diagram of a portion of a memory array 230 having groups of memory cells organized as a number of mixed mode physical blocks 232-0 (BLOCK 0), 232-1 (BLOCK 1), ..., 232-M (BLOCK M), in accordance with a number of embodiments of the present disclosure. Although not shown in FIG. 2, one of ordinary skill in the art will appreciate that the memory array 230 can be located on a semiconductor die along with various peripheral circuitry associated with the operation thereof. The memory cells of array 230 can be, for example, non-volatile floating gate flash memory cells having a NAND architecture. However, embodiments of the present disclosure are not limited to a particular memory type.

The memory array 230, which can be one of a plurality of arrays on a memory device (e.g memory device 110 in FIG. 1). The blocks 232-0 (BLOCK 0), 232-1 (BLOCK 1), ..., 232-M (BLOCK M) can be mixed mode blocks and can be referred to collectively as blocks 232. In the example shown in FIG. 2, the indicator "M" is used to indicate that the memory device 230 can include a number of physical blocks. As an example, the number of physical blocks in memory array 230 may be 128 blocks, 4,096 blocks, or 32,768 blocks, however embodiments are not limited to a particular number of physical blocks in a memory array 230.

In the embodiment illustrated in FIG. 2, each physical block 232 includes which can be erased together as a unit (e.g., the cells in each physical block can be erased in a substantially simultaneous manner as an erase unit). As shown in FIG. 2, each physical block 232 comprises a number of physical rows 234-0, 234-1, ..., 234-R of memory cells that can each be coupled to a respective access line (e.g., word line). The number of rows in each physical block can be 32, 64, or 128, but embodiments are not limited to a particular number of rows, which can be referred to collectively as rows 234, per block 232.

As one of ordinary skill in the art will appreciate, each row 232 can comprise a number of physical pages of cells. A physical page of cells can refer to a number of memory cells that are programmed and/or read together or as a functional group. In the embodiment shown in FIG. 2, each row 232 can comprise one physical page of cells. However, embodiments of the present disclosure are not so limited. For instance, each row 232 can comprise multiple physical pages of cells (e.g., an even page associated with cells coupled to even-numbered bit lines, and an odd page associated with cells coupled to odd numbered bit lines). Additionally, for XLC mode cells, a physical page can store multiple logical pages of data with each cell in a physical page contributing a bit toward a logical lower page, a bit toward a logical upper page, and one or more bits toward a respective number of logical intermediate (e.g., middle) pages.

In the example shown in FIG. 2, a physical page corresponding to a row 232 can store a number of sectors 236-0, 236-1, . . . , 236-S of data (e.g., an amount of data corresponding to a host sector, such as 512 bytes). The sectors 236 may comprise user data as well as overhead data, such as error correction code (ECC) data and logical block address (LBA) data.

It is noted that other configurations for the physical blocks 232, rows 234, sectors 236, and pages are possible. For example, the rows 234 of the physical blocks 232 can each store data corresponding to a single sector which can include, for example, more or less than 512 bytes.

FIG. 3 is a table 340 illustrating comparisons of actual cycle counts to effective cycle counts for a number of different XLC operating modes in accordance with a number of embodiments of the present disclosure. The example shown in FIG. 3 assumes an amount of host data "Y" is written to mixed mode blocks in SLC mode and twice as much data "2Y" is written (e.g., in association with garbage collection) to the mixed mode block in an XLC mode (e.g., as garbage collection data). Column 344 represents actual physical cycle counts 344-1, 344-2, and 344-3 corresponding to respective XLC configurations 342-1 (MLC/2-bit per cell), 343-2 (TLC/3-bit per cell), and 342-3 (QLC/4-bit per cell). Column 346 represents mixed mode cycle counts (e.g., "effective" cycle counts) 346-1, 346-2, and 346-3 corresponding to the respective XLC configurations 342-1, 342-2, and 342-3 for a given wear ratio (e.g., a wear ratio of 2 in this example). The wear ratio of SLC mode cycles to XLC mode cycles can be accounted for via the determined effective cycle count in accordance with embodiments described herein. For instance, for a determined wear ratio of 2, a mixed mode cycle counter can be incremented by a first amount (e.g., S) for each SLC mode cycle and by a different amount (e.g., WR×X) for each XLC mode cycle, where "WR" is the wear ratio (e.g., 2 in this example), "S" is the quantity of actual SLC mode cycles, and "X" is the quantity of actual XLC mode cycles. In this manner, the count of the mixed mode cycle counter will be an effective (e.g., scaled) cycle count as opposed to a true physical cycle count. Therefore, using the effective cycle count for device specifications, as opposed to an actual cycle count, can result in a higher TBW specification, for example.

In FIG. 3, for MLC mode configuration 342-1, 50% of the total actual cycles 344-1 are SLC mode cycles (e.g., 2 actual SLC mode cycles and 2 actual MLC cycles). However, taking into account the wear ratio of 2 yields an effective cycle count 346-1 resulting in SLC usage effectively accounting for 33% (⅓) of the total cycles. For TLC mode configuration 342-2, 60% of the total actual cycles 344-2 are SLC mode cycles (e.g., 3 actual SLC mode cycles and 2 actual TLC cycles). However, taking into account the wear ratio of 2 yields an effective cycle count 346-2 resulting in SLC usage effectively accounting for about 42% (3/7) of the total cycles. For QLC mode configuration 342-3, 66% (⅔) of the total actual cycles 344-3 are SLC mode cycles (e.g., 4 actual SLC mode cycles and 2 actual QLC cycles). However, taking into account the wear ratio of 2 yields an effective cycle count 346-3 resulting in SLC usage effectively accounting for 50% of the total cycles.

The effective cycle count provides a more accurate cell wear value. This is done using a wear ratio. In FIG. 3 for example, the wear ratio is 2. Therefore when using an effective cycle count, the SLC usage accounts for 33% of total cycles for memory blocks in MLC mode based on equation 346-1, 42% of total cycles for equation 346-2 in TLC mode, and 50% of total cycles for equation 346-3 in QLC mode.

In a number of embodiments, various trim settings corresponding to mixed mode operation can be adjusted to achieve a particular wear ratio of SLC operation wear to XLC operation wear. Trim settings that can be adjusted can include various write trims and/or erase trims. For example, write trims can include a program start voltage, program verification voltage(s), and program step voltage(s), among others. Erase trims can include an erase verify voltage, for example, which can be adjusted to result in a shallow erase. Adjustments to SLC mode trim settings, such as reducing the program start voltage, program verify voltage, and/or step voltage can reduce the wear experienced by the mixed mode blocks due to SLC operation, which can help to increase the wear ratio. Additionally, the SLC mode erase verify voltage can be reduced (e.g., such that it has a smaller magnitude), which can also reduce the wear due to the SLC mode erase and help to increase the wear ratio. In a number of embodiments, the adjusted SLC trim settings may be applied only to mixed mode blocks that are to be written in SLC mode. For example, it may not be beneficial to perform a shallow erase operation on a mixed mode block to be written in XLC mode since the shallow erase may have an effect on the accuracy of XLC writing.

In one or more embodiments the mixed mode cycle count can be determined according to a relationship:

$$\frac{((S) + (WR \times X))}{WR},$$

wherein "S" is a determined quantity of SLC mode cycles (e.g., erases), "X" is a determined quantity of XLC mode cycles (e.g., erases), and "WR" is a wear ratio of SLC operation wear to XLC operation wear. In a number of embodiments, a cycle count increment factor can be in associated with incrementing the effective cycle count. As an example, if the cycle count increment factor is "1", then the count of the effective cycle count counter is incremented by 1 for each actual SLC mode cycle and by 2 for each actual XLC mode cycle (e.g., for WR=2). However, if the cycle count increment factor is "10", then the count of the effective cycle count counter is incremented by 10 for each actual SLC mode cycle and by 20 for each actual XLC mode cycle. Providing a cycle count increment factor of 10 can provide benefits such as avoiding the need to perform floating point operations, which may occur in instances in which the wear ratio is a non-integer value, for example. In cases in which a cycle count increment factor is used, normalization can occur to account for the increment factor.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
 a memory comprising mixed mode blocks of memory cells; and
 a controller coupled to the memory and configured to:
  track single level cell (SLC) mode cycles and extra level cell (XLC) mode cycles performed on the mixed mode blocks;
  maintain a mixed mode cycle count corresponding to the mixed mode blocks; and
  adjust the mixed mode cycle count differently for mixed mode blocks operated in a SLC mode than for mixed mode blocks operated in a XLC mode, wherein the controller being configured to adjust the mixed mode cycle count includes the controller being configured to increment the mixed mode cycle count, and wherein an increment difference between SLC mode cycles and XLC mode cycles is based on a determined wear ratio of SLC operation wear to XLC operation wear.

2. The apparatus of claim 1, wherein the mixed mode cycle count is a scaled cycle count having a different value than an actual quantity of physical cycles performed on the mixed mode blocks.

3. The apparatus of claim 1, wherein the controller is configured to perform wear leveling based on the mixed mode cycle count as opposed to based on an unscaled cycle count corresponding to a quantity of actual physical cycles experienced by the mixed mode blocks.

4. The apparatus of claim 1, wherein the apparatus is a solid state drive (SSD).

5. The apparatus of claim 4, wherein the controller is configured to report a drive health indicator of the SSD to a host based on the mixed mode cycle count as opposed to based on an unscaled cycle count corresponding to a quantity of actual physical cycles experienced by the mixed mode blocks.

6. The apparatus of claim 1, wherein a difference by which the controller adjusts the mixed mode cycle count for mixed mode blocks operated in the SLC mode than for mixed mode blocks operated in the XLC mode is based on a wear ratio of SLC operation wear to XLC operation wear resulting from adjusted trim settings.

7. The apparatus of claim 6, wherein the mixed mode cycle count is a mixed mode erase count.

8. The apparatus of claim 6, wherein the mixed mode cycle count is a mixed mode program count.

9. An apparatus, comprising:
 a memory comprising mixed mode blocks of memory cells; and
 a controller coupled to the memory and configured to:
  track single level cell (SLC) mode cycles and extra level cell (XLC) mode cycles performed on the mixed mode blocks;
  maintain a mixed mode cycle count corresponding to the mixed mode blocks; and
  adjust the mixed mode cycle count differently for mixed mode blocks operated in a SLC mode than for mixed mode blocks operated in a XLC mode, wherein the mixed mode cycle count is a scaled cycle count having a different value than an actual quantity of physical cycles performed on the mixed mode blocks.

10. An apparatus, comprising:
 a memory comprising mixed mode blocks of memory cells; and
 a controller coupled to the memory and configured to:
  track single level cell (SLC) mode cycles and extra level cell (XLC) mode cycles performed on the mixed mode blocks;
  maintain a mixed mode cycle count corresponding to the mixed mode blocks;
  adjust the mixed mode cycle count differently for mixed mode blocks operated in a SLC mode than for mixed mode blocks operated in a XLC mode; and
  perform wear leveling based on the mixed mode cycle count as opposed to based on an unscaled cycle count corresponding to a quantity of actual physical cycles experienced by the mixed mode blocks.

11. A solid state drive (SSD), comprising:
 a memory comprising mixed mode blocks of memory cells; and
 a controller coupled to the memory and configured to:
  track single level cell (SLC) mode cycles and extra level cell (XLC) mode cycles performed on the mixed mode blocks;
  maintain a mixed mode cycle count corresponding to the mixed mode blocks;
  adjust the mixed mode cycle count differently for mixed mode blocks operated in a SLC mode than for mixed mode blocks operated in a XLC mode; and
  report a drive health indicator of the SSD to a host based on the mixed mode cycle count as opposed to based on an unscaled cycle count corresponding to a quantity of actual physical cycles experienced by the mixed mode blocks.

12. An apparatus, comprising:
 a memory comprising mixed mode blocks of memory cells; and
 a controller coupled to the memory and configured to:
  track single level cell (SLC) mode cycles and extra level cell (XLC) mode cycles performed on the mixed mode blocks;
  maintain a mixed mode cycle count corresponding to the mixed mode blocks; and
  adjust the mixed mode cycle count differently for mixed mode blocks operated in a SLC mode than for mixed mode blocks operated in a XLC mode, wherein a difference by which the controller adjusts the mixed mode cycle count for mixed mode blocks operated in the SLC mode than for mixed mode blocks operated in the XLC mode is based on a wear ratio of SLC operation wear to XLC operation wear resulting from adjusted trim settings.

13. The apparatus of claim 12, wherein the mixed mode cycle count is a mixed mode erase count.

14. The apparatus of claim 12, wherein the mixed mode cycle count is a mixed mode program count.

* * * * *